United States Patent [19]
Nakamori

[11] Patent Number: 5,972,740
[45] Date of Patent: Oct. 26, 1999

[54] LAYOUT ALGORITHM FOR GENERATING POWER SUPPLY INTERCONNECTIONS FOR AN LSI CIRCUIT

[75] Inventor: Tsutomu Nakamori, Kawasaki, Japan

[73] Assignee: Fujitsu Limited, Kawasaki, Japan

[21] Appl. No.: 08/900,881

[22] Filed: Jul. 25, 1997

[30] Foreign Application Priority Data

Dec. 16, 1996 [JP] Japan .................................. 8-335457

[51] Int. Cl.[6] .......................... H01L 21/82; H01L 21/44; G06F 15/00
[52] U.S. Cl. .......................... 438/129; 364/491; 438/599
[58] Field of Search ............................ 364/491; 438/129, 438/599

[56] References Cited

U.S. PATENT DOCUMENTS

| | | | |
|---|---|---|---|
| 5,145,800 | 9/1992 | Arai et al. .................................. | 437/51 |
| 5,493,506 | 2/1996 | Kazuhiro et al. . | |
| 5,666,288 | 9/1997 | Jones et al. .............................. | 364/490 |
| 5,675,501 | 10/1997 | Aoki ........................................ | 364/490 |
| 5,712,793 | 1/1998 | Scepanovic et al. .................... | 364/490 |
| 5,824,570 | 10/1998 | Aoki et al. ............................... | 438/128 |

FOREIGN PATENT DOCUMENTS 05 326843  12/1993  Japan .

*Primary Examiner*—Richard Booth
*Assistant Examiner*—Neal Berezny
*Attorney, Agent, or Firm*—Armstrong, Westerman, Hattori, McLeland & Naughton

[57] ABSTRACT

A method of designing an integrated circuit device having a plurality of arrays of cells on a chip and a plurality of circuit blocks larger in scale than the cells and embedded among the arrays of cells, including the steps of placing the cells and the circuit blocks in a region of a chip, grouping adjacent ones of the circuit blocks, generating a group power supply ring around the grouped circuit blocks and a block power supply ring around another one of the circuit blocks, and generating a grid-shaped pattern of internal power supply interconnections on the chip which are connected to the group power supply ring or the block power supply ring.

6 Claims, 14 Drawing Sheets

LAYOUT ALGORITHM FOR GENERATING POWER SUPPLY INTERCONNECTIONS FOR AN LSI CIRCUIT

BACKGROUND OF THE INVENTION

1. Field of the Invention

The present invention relates to a method of designing an integrated circuit device, and an integrated circuit device designed by such a method, and more particularly to an improvement in power supply ring interconnections for circuit blocks such as macros in an integrated circuit device.

2. Description of the Related Art

Large-scale integration (LSI) circuit devices have a network of power supply interconnections for supplying electric energy to circuits on LSI circuit chips. Circuit blocks such as macros can be embedded in gate arrays, which are a type of LSI circuit. In such gate arrays, blocks that have a circuit scale greater than cells comprising basic cells are embedded in a region where basic cells are arranged regularly. Standard cell chips have an array of circuit cells arranged in a column, the circuit cells having different sizes along the column and also different bulk structures respectively. In such standard cell chips, large-scale circuit blocks are embedded among arrays of circuit cells.

Generally, a ring of power supply interconnections is disposed around blocks, and connected to power supply terminals of the blocks. The ring of power supply interconnections is connected to a grid pattern of power supply interconnections in a cell array region outside of the blocks.

ASICs (Application Specific Integrated Circuits) such as gate arrays and standard cells are generally designed using an automatic interconnection designing software package as a designing tool. According to a process of mechanically providing blocks with a power supply ring using such a designing tool, however, if a plurality of blocks are positioned closely to each other, it is difficult to generate power supply interconnections while effectively utilizing an available space.

SUMMARY OF THE INVENTION

It is therefore an object of the present invention to provide a layout process capable of generating power supply interconnections in an LSI circuit.

Another object of the present invention is to provide a large-scale integration circuit device which has power supply interconnections.

According to an aspect of the present invention, there is provided a method of designing an integrated circuit device having a plurality of arrays of cells on a chip and a plurality of circuit blocks larger in scale than the cells and embedded among the arrays of cells, comprising the steps of placing the cells and the circuit blocks in a region of a chip, grouping adjacent ones of the circuit blocks, generating a group power supply ring around the grouped circuit blocks and a block power supply ring around another one of the circuit blocks, and generating a grid-shaped pattern of internal power supply interconnections on the chip which are connected to the group power supply ring or the block power supply ring.

The step of grouping adjacent ones of the circuit blocks comprises the steps of selecting a circuit block or a group of circuit blocks adjacent to a given circuit block or a given group of circuit blocks with no cell interposed therebetween, the circuit blocks or groups of circuit blocks having confronting sides having substantially the same length as each other and being closed to each other, and grouping the circuit blocks or groups of circuit blocks.

The method further comprises the step of generating power supply interconnections connecting the group power supply ring to power supply terminals on sides of the grouped circuit blocks which correspond to the group power supply ring.

The group power supply ring has a width large enough to supply currents to be consumed by the grouped circuit blocks.

The power supply interconnections have widths large enough to supply currents to be consumed by the grouped circuit blocks.

According to another aspect of the present invention, there is provided an integrated circuit device having a plurality of arrays of cells and a plurality of circuit blocks larger in scale than the cells and embedded in the chip among the arrays of cells, comprising a group power supply ring disposed around a block group of adjacent ones of the circuit blocks, a power supply ring disposed around another one of the circuit blocks, power supply interconnections connecting the group power supply ring and the block power supply ring to power supply terminals of the circuit blocks surrounded by the group power supply ring and the block power supply ring, and a grid-shaped pattern of internal power supply interconnections on the chip which are connected to the group power supply ring or the block power supply ring, wherein currents is supplied from the internal power supply interconnections to the arrays of cells, currents is supplied from the group power supply ring to the circuit blocks of the group, and currents is supplied from the block power supply ring to another circuit block.

The internal power supply interconnections include parallel power supply interconnections are connected to interconnections of the group power supply ring which extend substantially perpendicularly to the parallel power supply interconnections.

According to still another aspect of the present invention, there is provided a recording medium accessible by a computer and storing a designing program for designing an integrated circuit device having a plurality of arrays of cells on a chip and a plurality of circuit blocks larger in scale than the cells and embedded among the arrays of cells, the design program causing the computer to perform the steps of placing the cells and the circuit blocks in a region of a chip, grouping adjacent ones of the circuit blocks, generating a group power supply ring around the grouped circuit blocks and a block power supply ring around another one of the circuit blocks, and generating a grid-shaped pattern of internal power supply interconnections on the chip which are connected to the group power supply ring or the block power supply ring.

As described above, a plurality of adjacent circuit blocks which satisfy certain conditions are grouped, and a group power supply ring is assigned to the grouped circuit blocks. As a result, the area or space taken up by the block power supply ring is reduced.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
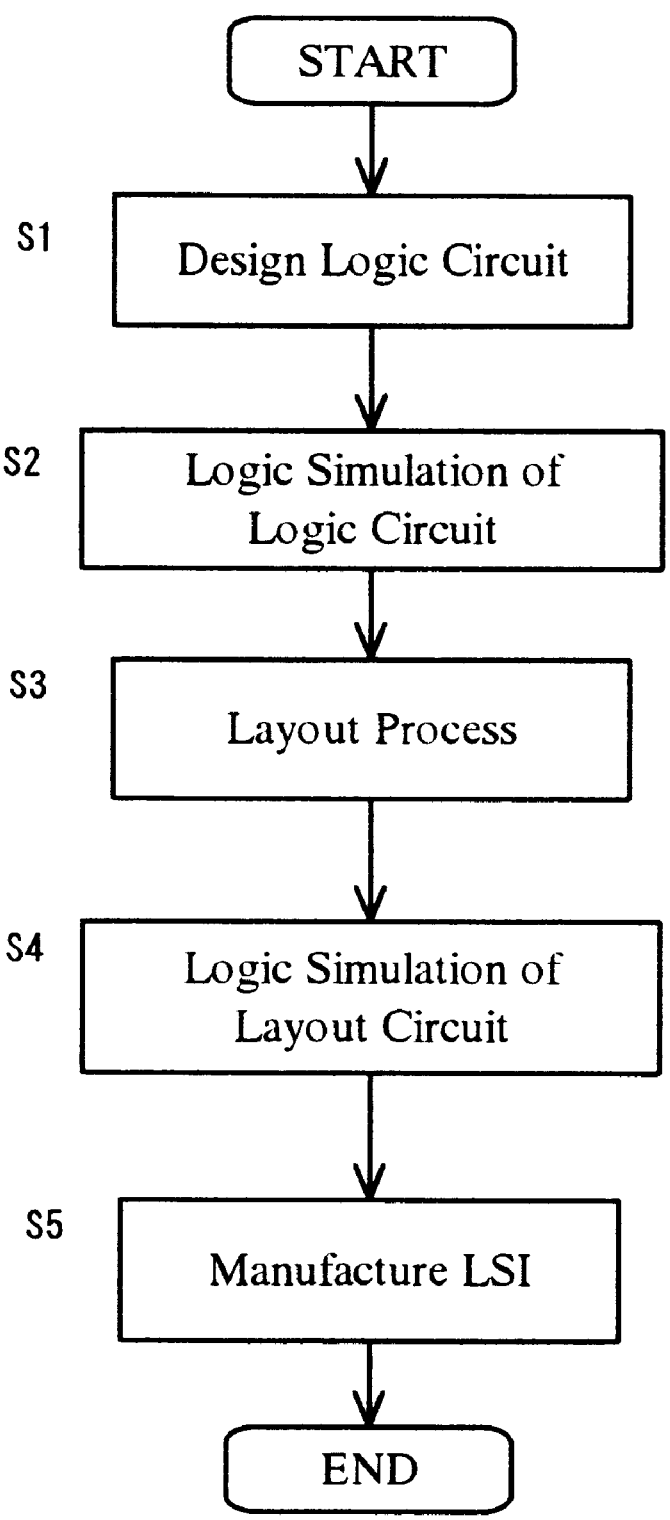
FIG. 1 is a flowchart of a process of manufacturing a semiconductor device.

FIG. 1 shows a process of designing a semiconductor device. A large-scale integration circuit device such as an ASIC or the like is designed according to the process shown in FIG. 1. As shown in FIG. 1, a logic circuit is designed in a step S1. Specifically, necessary cells and macros are read from a logic library which contains registered data of cells and macros, and combined to design a logic circuit.

For a gate array, each of the cells comprises a set of circuit which includes one or more basic cells for performing a predetermined function. For a standard cell chip, each of the cells comprises a set of logic circuits for performing a predetermined function, arranged in a column and having substantially the same height and respective widths different along the column depending on the circuit scale. Each of the macros comprises a cluster of circuits of a greater scale, and the rules of power supply interconnections of cell arrays are not applicable to the macros. A macro will hereinafter be referred to as a circuit block or a block.

Embedded gate arrays have a matrix of basic cells and a regular pattern of power supply interconnections provided for the array of such basic cells. A macro or block is a large-scale circuit which normally does not employ basic cells. The widths of power supply terminals and power supply interconnections of such a macro or block are selected on the basis of the circuit scale and the magnitude of a consumed current. Standard cell chips have an array of cells and a regular pattern of power supply interconnections provided for the array of cells. Macros or blocks in standard cell chips are also large-scale circuits facing a plurality of cell arrays.

A typical embedded gate array will hereinafter be described by way of example below.

After a logic circuit comprising a combination of cells and blocks is designed, a logic simulation of the logic circuit is carried out in a step S2. In the logic simulation, it is checked whether the logic circuit effects expected logic operations or not, i.e., whether a pattern outputted by the logic circuit with respect to a predetermined input pattern agrees with an expected output pattern or not.

If the logic circuit passes the logic check in the logic simulation in the step S2, then the cells and blocks of the logic circuit are placed on a chip, and a layout of power supply interconnections and circuit interconnections is generated according to a layout process in a step S3. According to the present invention, power supply interconnections are efficiently positioned in the layout process. The layout process will be described later on.

Thereafter, resistance and capacitance values due to the interconnections produced in the layout process are added, and a logic simulation is carried out again on the logic circuit in a step S4. After the logic circuit is verified for its operation in the logic simulation in the step S4, an actual LSI circuit is manufactured on a wafer in a step S5.

Figure 2:
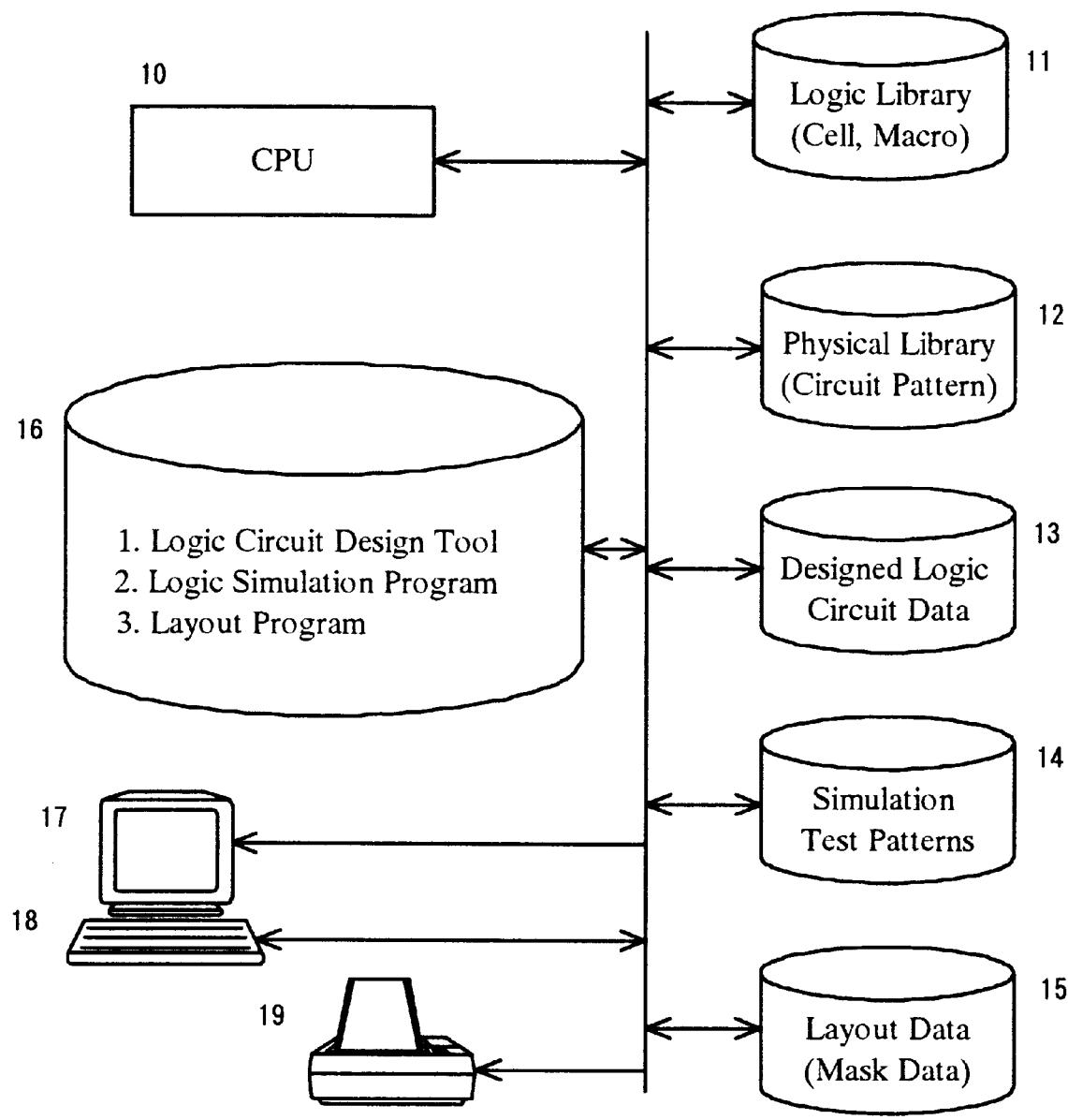
FIG. 2 is a block diagram of an LSI designing system.

FIG. 2 shows in block form an LSI designing system for executing the steps S1, S2, S3, S4 shown in FIG. 1. As shown in FIG. 2, the LSI designing system has a CPU 10 to which various files 11–16 are accessibly connected. The files 11–16 include a file 11 containing the logic library, a file 12 containing a physical library of circuit patterns of cells and macros, a file 13 of designed logic circuit data, a file 14 of simulation test patterns, and a file 15 of layout data which are generated when cells, blocks, and interconnections are positioned in layouts.

The LSI designing system also has a design tool file 16 connected to the CPU 10 and the files 11–16. The design tool file 16 contains design tools including, for example, a logic circuit designing tool, a logic simulation program, a layout program, etc.

These files are implemented by a magnetic disk, a magnetooptical disk, or a recording medium such as a floppy disk, a CD-ROM, or the like. The LSI designing system further includes a display monitor 17 which is used in the logic circuit designing process and the layout process, a keyboard 18 as an input device, and a printer 19 as an output device.

Figure 3:
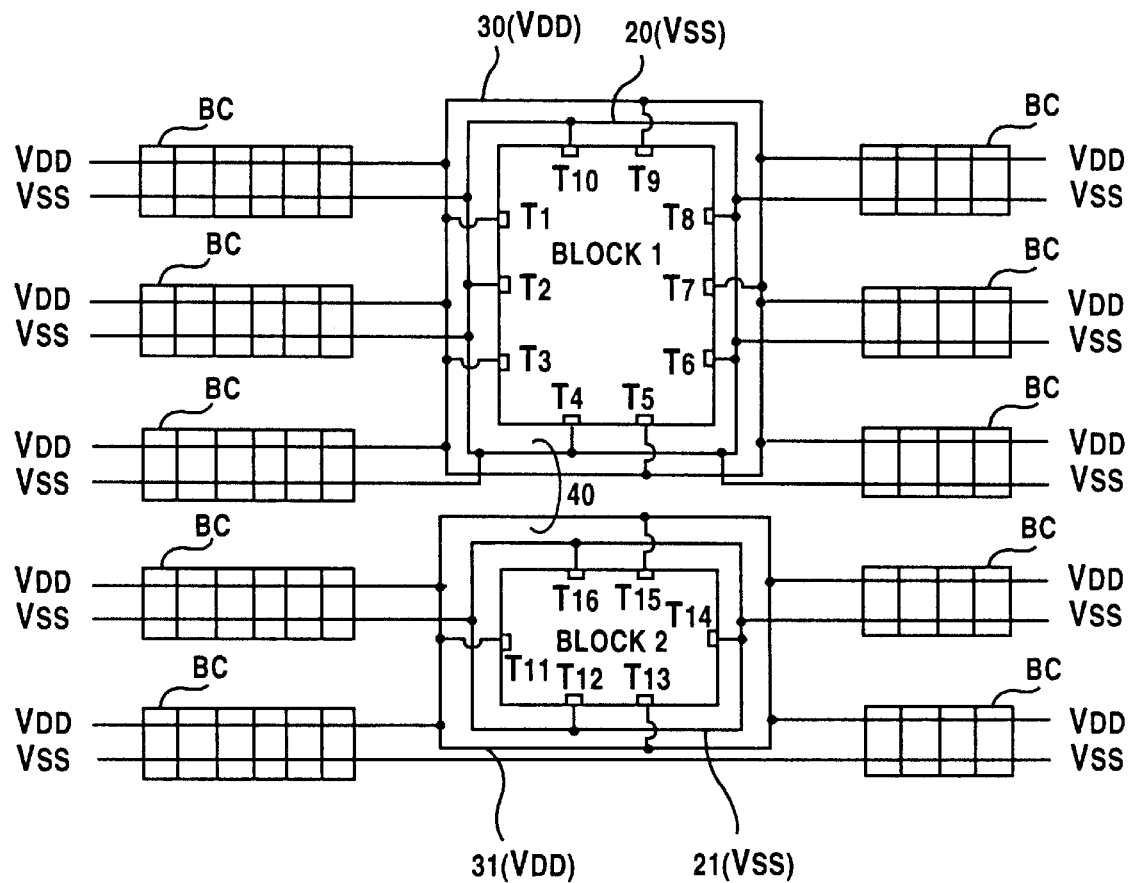
FIG. 3 is a block diagram illustrative of problems with a layout of power supply interconnections for adjacent blocks.

FIG. 3 illustrates problems with a layout of power supply interconnections for adjacent blocks. FIG. 3 shows on an enlarged scale a portion of a gate array where two blocks 1, 2 are embedded. In FIG. 3, circuit interconnections are omitted from illustration, whereas power supply interconnections are illustrated. Basic cells BC which serve as basic gates are disposed in a plurality of arrays. Power supply interconnections which provide high and low power supplies $V_{DD}$, $V_{SS}$ are disposed along the basic cell arrays, and currents are supplied to the power supply interconnections.

Circuit blocks (macros) 1, 2 comprising large-scale circuits are embedded in arbitrary positions among the basic cell arrays. The blocks 1, 2 have power supply terminals T1–T16 disposed along their outer peripheral sides, the power supply terminals T1–T16 being positioned according to rules different from the rules for the power supply interconnections. Generally, power supply rings 20, 30, 21, 31 are disposed around the blocks 1, 2. The power supply terminals T1–T10 of the block 1 are directly connected to the power supply rings 20, 30, and the power supply interconnections which provide high and low power supplies $V_{DD}$, $V_{SS}$ extend through some of the basic cell arrays and are connected to the power supply rings 20, 30. Similarly, the power supply terminals T11–T16 of the block 2 are directly connected to the power supply rings 21, 31, and the power supply interconnections in the basic cell arrays which provide high and low power supplies $V_{DD}$, $V_{SS}$ extend through the other basic cell arrays and are connected to the power supply rings 21, 31. Therefore, the power supply rings 20, 30, 21, 31 serve to interface the rule of regularly disposed power supply interconnections of the basic cell arrays and the rule of the power supply terminals of the blocks 1, 2 to respectively. Furthermore, the power supply rings 20, 30, 21, 31 also serve to connect the power supply interconnections $V_{DD}$, $V_{SS}$ between the left and right groups of the basic cell arrays. Therefore, the widths of the power supply rings 20, 30, 21, 31 may increase depending on the location where the blocks 1, 2 are positioned.

Currents consumed in the blocks 1, 2 are calculated in advance, and the number of power supply terminals, the widths of power supply interconnections, and the widths of power supply rings which are sufficient to supply those consumed currents are determined and registered as attribute data of the blocks 1, 2 in the physical library.

The power supply rings 20, 30, 21, 31 disposed around the blocks 1, 2 allow power supply interconnections for the blocks 1, 2 to be easily arranged automatically in the embedded gate array. If adjacent blocks having confronting sides of substantially the same lengths are present in the embedded gate array as shown in FIG. 3, however, the efficiency of power supply interconnections in an area 40 between the confronting sides is poor. Specifically, both the power supply rings 20, 30 of the block 1 and the power supply rings 21, 31 of the block 2 are positioned adjacent and parallel to each other in the area 40. The power supply rings 20, 30, 21, 31 comprise relatively wide interconnection layers because they are required to supply currents to circuits in the large-scale blocks 1, 2. The power supply rings 20, 30, 21, 31 which thus take up respective relatively large areas are located in the area 40, two for the block 1 and two for the block 2, and are relatively redundant in the area 40. If more blocks are positioned adjacent to each other and each assigned power supply rings automatically, then the efficiency of power supply interconnections in an area between those blocks is poorer.

According to the present invention, if two blocks are positioned adjacent to each other, as indicated by the area 40 in FIG. 3, the two blocks are grouped together, and common power supply rings are given to the group of the two blocks. Power supply interconnections are designed in the layout process based on the above basic principles.

Figure 4:
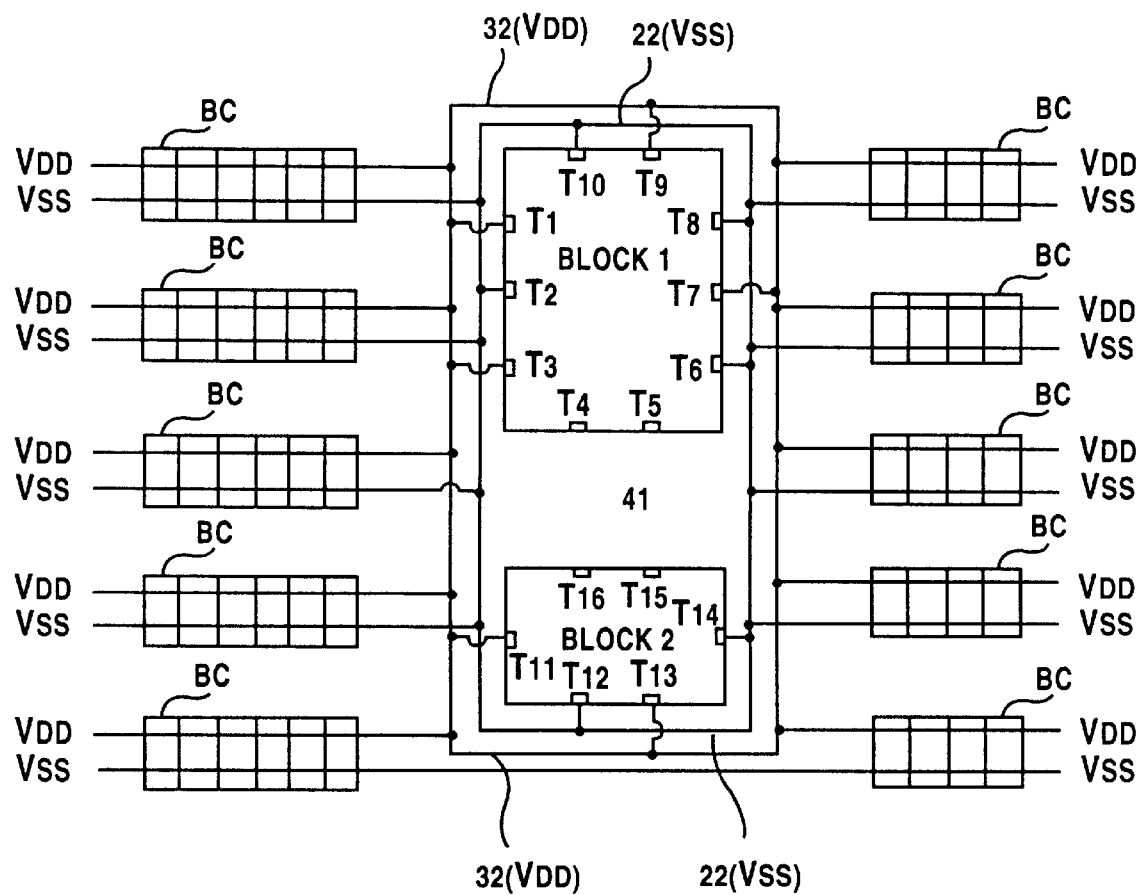
FIG. 4 is a block diagram of a layout of power supply interconnections improved over the layout shown in FIG. 3.

FIG. 4 shows a layout of power supply interconnections which are improved over the layout shown in FIG. 3 based on the above basic principles. Specifically, as shown in FIG. 4, the blocks 1, 2 are grouped together, and common power supply rings 22, 32 are assigned to the group of the blocks 1, 2. The blocks 1, 2 are closely spaced from each other by a relatively small distance if no problem arises out of such close spacing. Power supply interconnections from the basic cell arrays are connected through the common power supply rings 22, 32 to power supply terminals of the blocks 1, 2. It is necessary that the number and location of power supply terminals of the blocks 1, 2 and the width of power supply interconnections to be connected thereto be designed so as to be able to supply required currents to the blocks 1, 2 through not all the power supply terminals on the four sides of each of the blocks 1, 2. For example, the number and location of power supply terminals of the blocks 1, 2 and the width of power supply interconnections to be connected thereto may be designed so as to be able to supply required currents to the blocks 1, 2 through the power supply terminals on at least two sides of each of the blocks 1, 2. The widths of the common power supply rings 22, 32 are selected to be capable of supplying a total of currents to be consumed by the blocks 1, 2. In the blocks 1, 2, the power supply terminals are connected to circuits by internal power supply interconnections.

The above design parameters which select the number of sides of a block which have active power supply terminals for supplying sufficient currents to the block should be determined in view of various conditions. For example, if the design parameters are determined to use only one block side which has active power supply terminals for supplying sufficient currents, then blocks in consideration will be grouped highly flexibly. However, if the design parameters are determined to use three block sides which has active power supply terminals for supplying sufficient currents, then blocks in consideration will be grouped less flexibly.

Specific conditions to be considered with respect to the basic principles of the present invention will be described below. According to the first condition, no basic cell area should be present between two blocks or between a group of blocks and a new block. As described above, the rules for power supply interconnections suitable for basic cell arrays are applied to a basic cell area. Since those rules are different from the rules for blocks (macros), blocks with any cells comprising basic cells being positioned therebetween are not suitable for being grouped.

According to the second condition, the distance between two blocks or between a group of blocks and a new block or group should not be substantially large. Even if no cells are present between those blocks, once common power supply rings are assigned to the blocks, it will be difficult to use an area (e.g., an area 41 in FIG. 4) between the blocks as an area for passing interconnections therethrough, or limitations will be imposed on attempts to use such an area, as described later on.

According to the third condition, confronting sides of two blocks or a group of blocks and a new block or group should have substantially the same length. If the confronting sides have different lengths, common power supply rings assigned to the blocks will have a recess in their configuration. In such a recess, the density of interconnections extending from adjacent blocks is high. Furthermore, a large area is required to form the power supply rings. In addition, a complex algorithm will be needed when another block is to be included into the common group.

Figure 5:
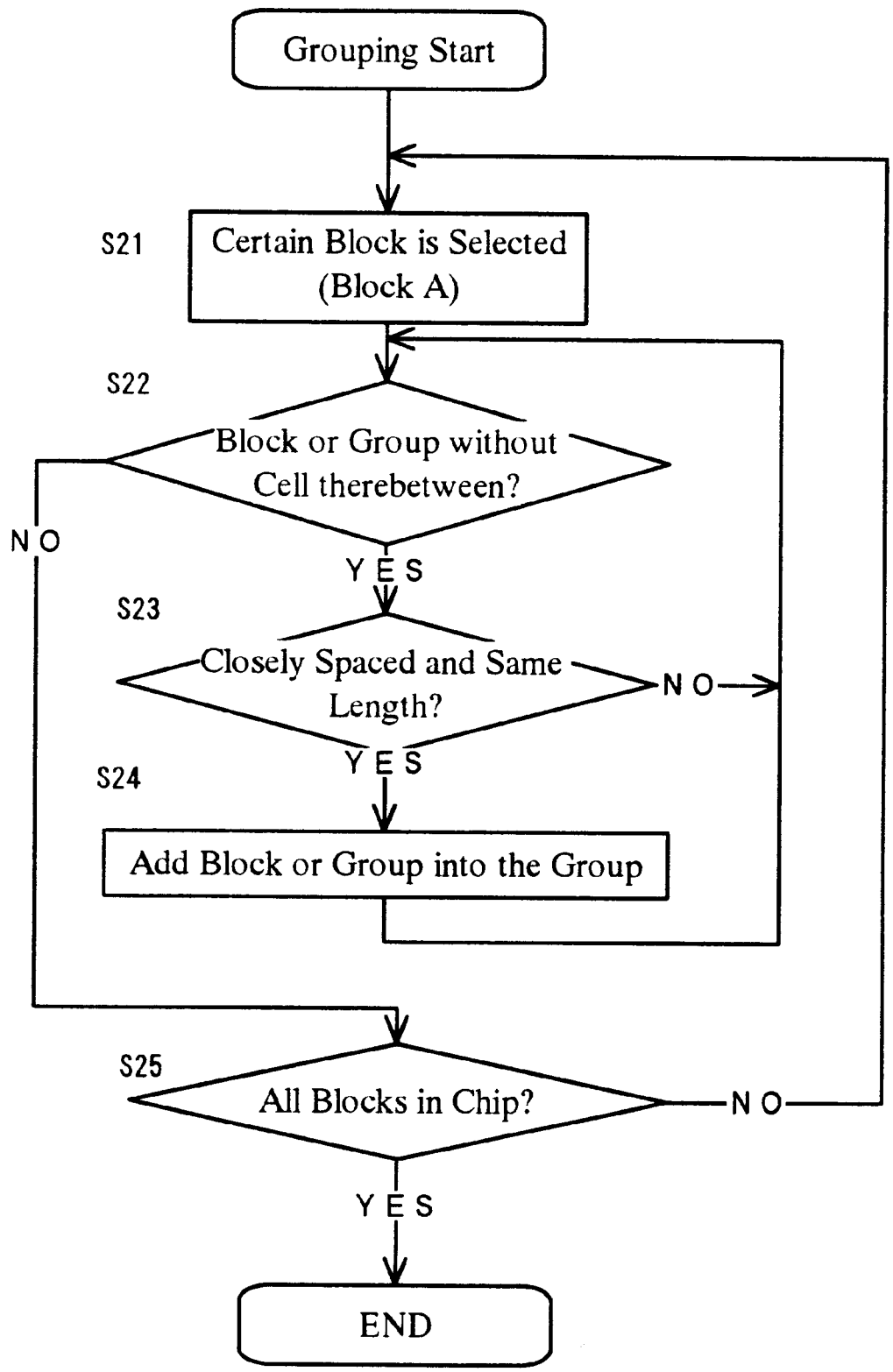
FIG. 5 is a flowchart of a grouping process of grouping blocks according to a grouping algorithm.
Figure 6A:
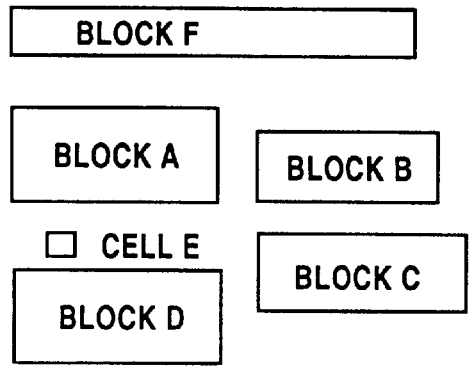
FIGS. 6A, 6B, and 6C are block diagrams showing the manner in which blocks are grouped according to the grouping process.
Figure 6B:
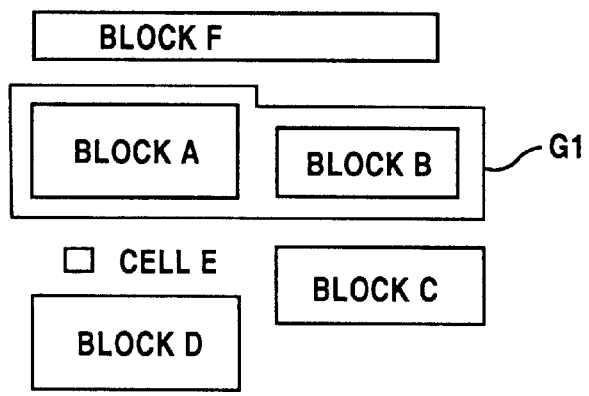
Figure 6C:
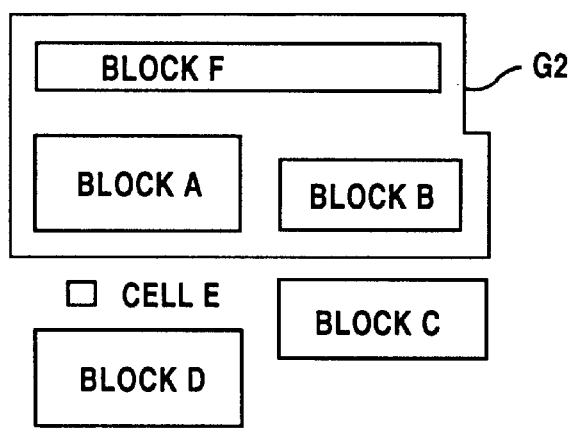

FIG. 5 shows a grouping process of grouping blocks according to a grouping algorithm. FIGS. 6A, 6B, and 6C show the manner in which blocks are grouped according to the grouping process. As shown in FIG. 6A blocks A, B, C, D, and a cell E are positioned adjacent to each other.

As shown in FIG. 5, a certain block is selected in a step S21. Various algorithms may be employed to determine which one of the blocks is to be selected. For example, a block positioned at the center in the cluster of blocks or a block at an end of the cluster of blocks may be selected. In the example shown in FIGS. 6A through 6C, the block A is selected.

Then, it is determined in a step S22 whether there is a block without a cell interposed between such a block and the block A or not. If there is such a block, then the block A and such a block cannot be grouped. In FIG. 6A, the cell E is positioned between the blocks A, D. Therefore, the block A and the block D cannot be grouped. Instead, blocks B, F are selected in the step S22. Then, it is determined whether the selected blocks are closely spaced and their confronting sides are of substantially the same length or not in a step S23. The block B is closely spaced from the block A, and their confronting sides are of substantially the same length. The block F, however, has a longer confronting side than the block A. Therefore, the block B is determined as belonging to a group G1 (see FIG. 6B) of the block A in a step S24.

Control then returns to the step S22 to select a block or group which satisfy the conditions in the steps S22, S23 with respect to the group G1 to which the blocks A, B belong. As a result, the block F is selected, making up a group G2 (see FIG. 6C) which consists of the blocks A, B, F. Since the blocks D, C do not satisfy the conditions in the steps S22, S23, the grouping process comes to an end. If there is another group without a cell interposed between such another group and the block or group already selected in the step S22, then the other group may be added to the same group if it satisfies the condition in the step S23. However, it is preferable not to group blocks whose all sides will not face the peripheral edges of the group.

Figure 7:
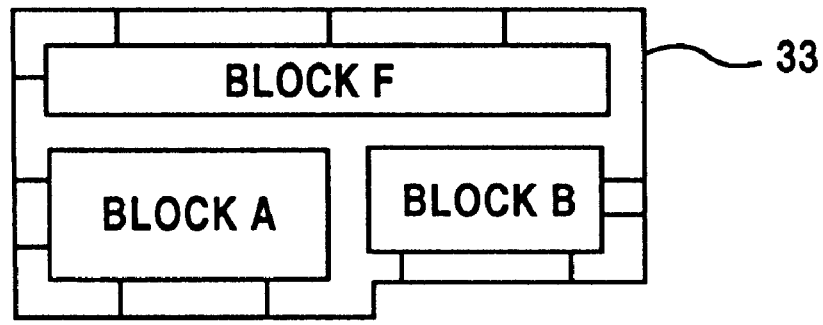
FIG. 7 is a block diagram showing grouped blocks with a power supply ring assigned thereto.

FIG. 7 shows grouped blocks with a power supply ring assigned thereto. As shown in FIG. 7, a common power supply ring 33 is disposed around blocks A, B, F, and power supply interconnections extend from power supply terminals on block sides confronting the common power supply ring 33 to the common power supply ring 33. In the example shown in FIG. 7, each of the blocks is designed such that currents consumed thereby can be supplied from power supply terminals on two sides. While the common power ring 33 is connected to the power supply terminals on two side of the block F, the common power ring 33 may be connected to the power supply terminals on three side of the block F. In FIG. 7, only one common power ring 33 is illustrated rather than two common power rings for connection to the power supply interconnections which provide high and low power supplies $V_{DD}$, $V_{SS}$.

Figure 8:
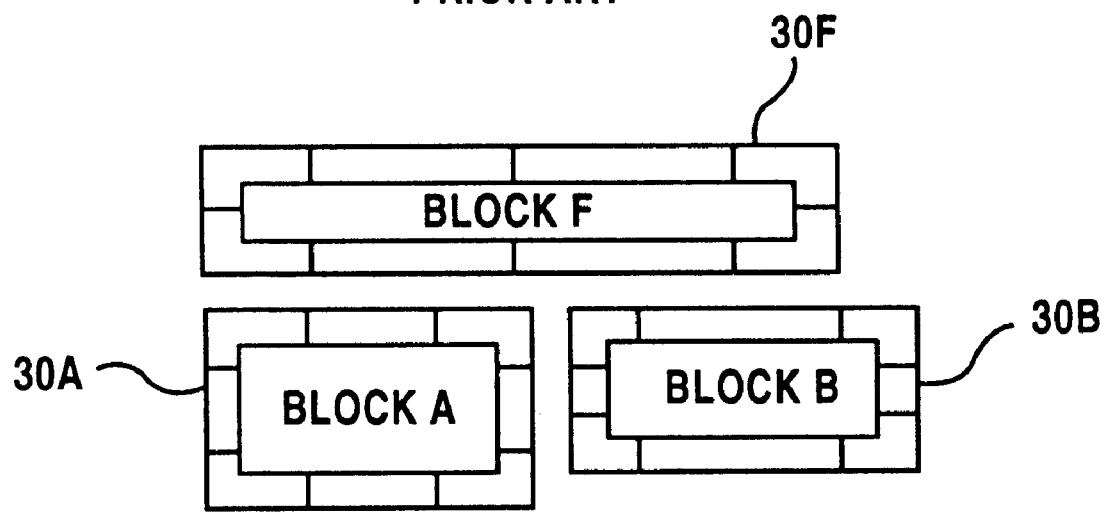
FIG. 8 is a block diagram showing independent blocks with respective power supply rings assigned thereto.

FIG. 8 shows for comparison independent blocks with respective power supply rings assigned thereto. In FIG. 8, power supply rings 30F, 30A, 30B are assigned respectively to blocks A, B, F. Since the power supply rings 30F, 30A, 30B extend together in an area between the blocks A, B, F, in duplicate manner, the efficiency of interconnections is poor.

Figure 9:
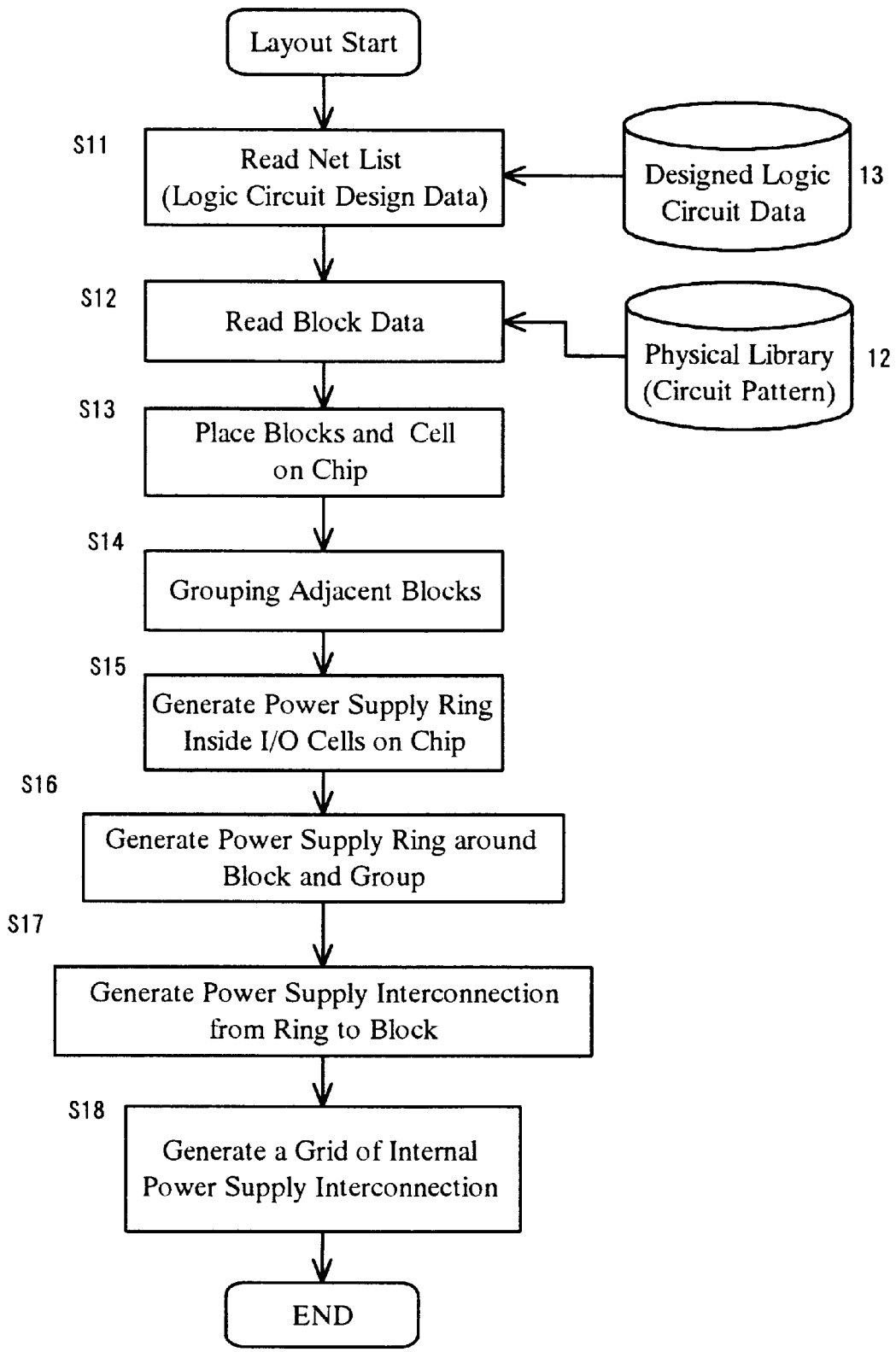
FIG. 9 is a flowchart of a detailed sequence of the layout process shown in FIG. 1.
Figure 10:
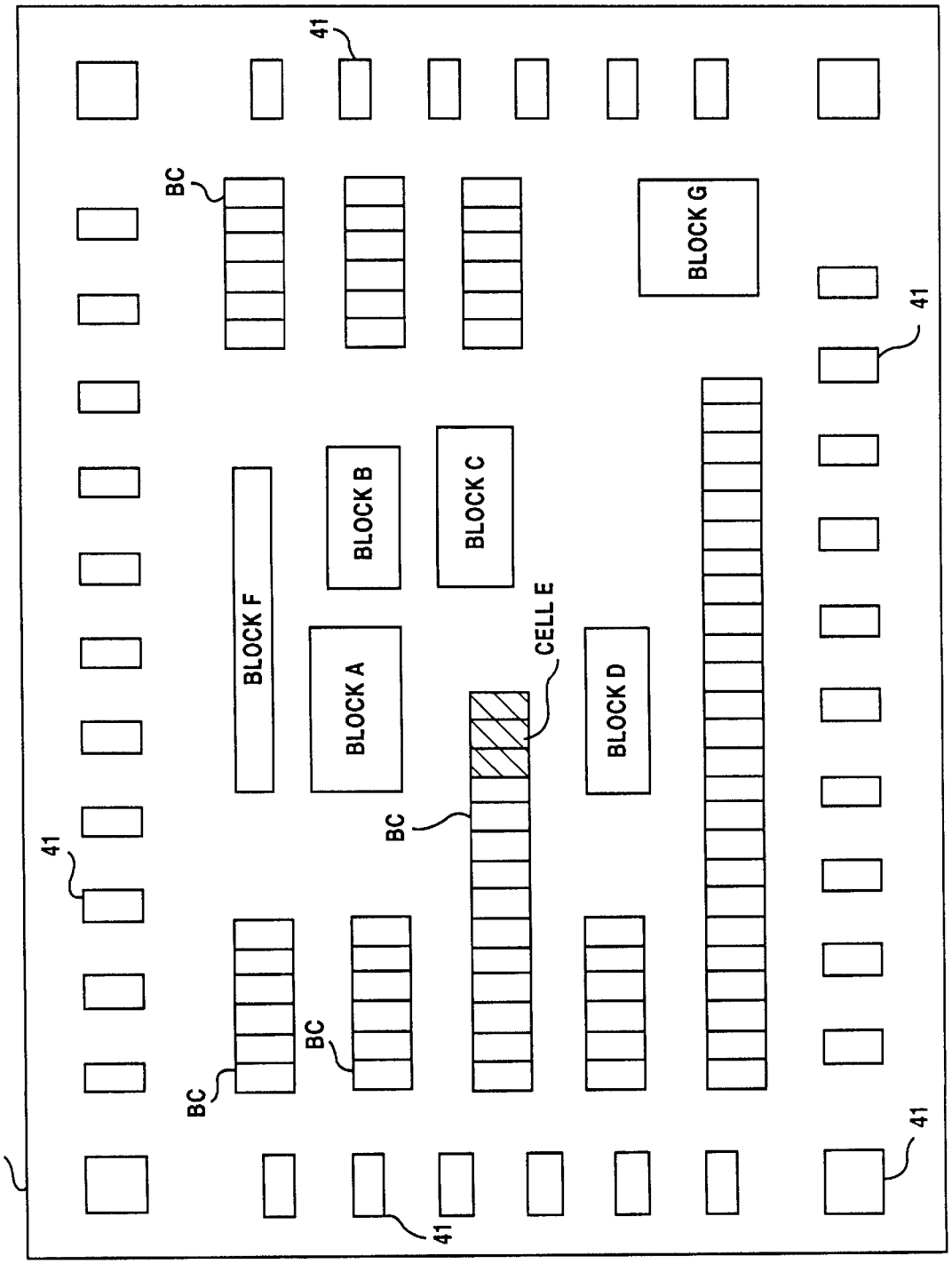
FIG. 10 is a block diagram showing an example illustrative of the layout process.
Figure 11:
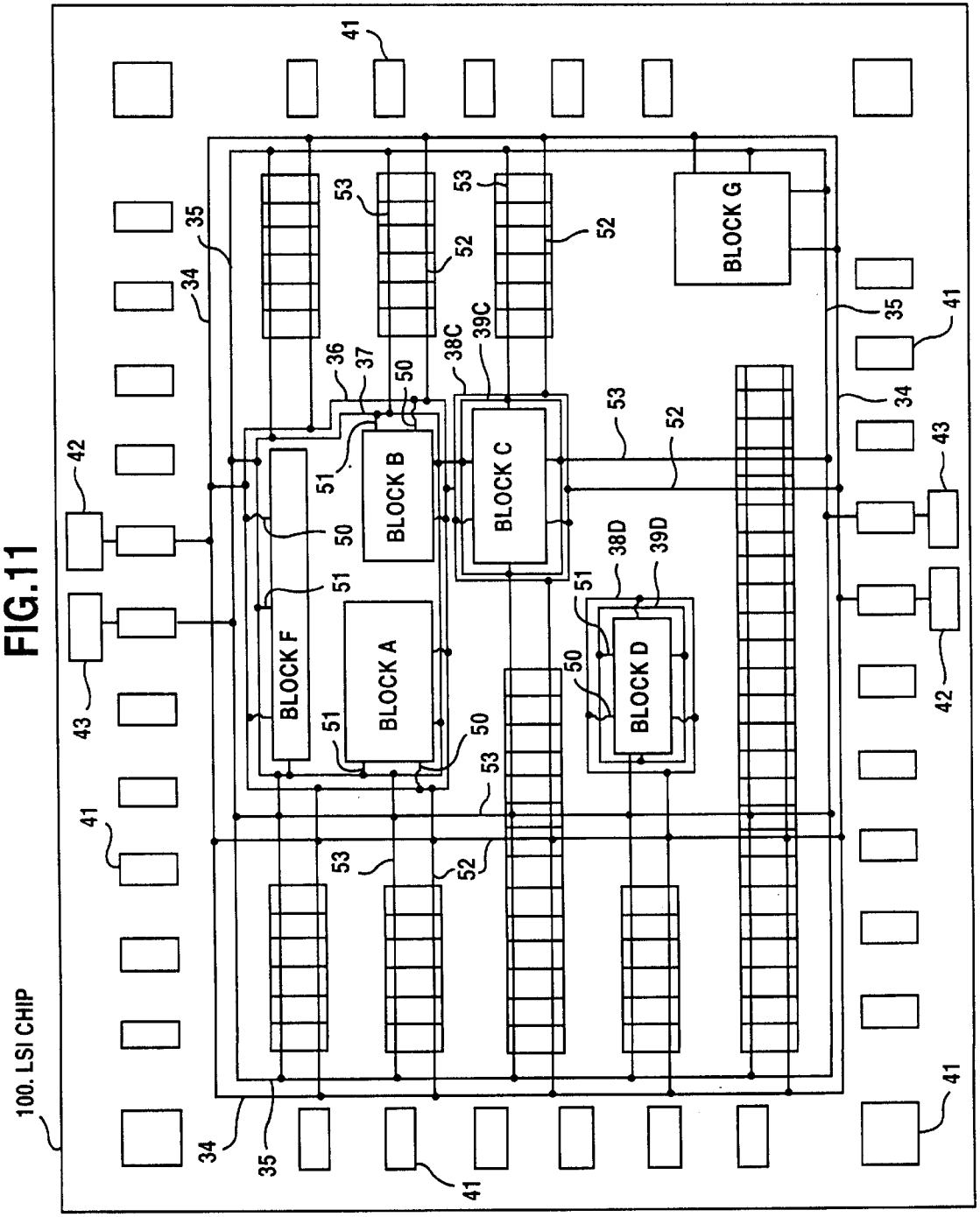
FIG. 11 is a block diagram showing power supply interconnections that are produced by the layout process in the example shown in FIG. 10.

FIG. 9 shows a detailed sequence of the layout process shown in FIG. 1. FIG. 10 shows an example illustrative of the layout process. FIG. 11 shows power supply interconnections that are produced by the layout process in the example shown in FIG. 10.

As shown in FIG. 9, a net list of design data of a designed logic circuit is read from the file 13 in a step S11. Block data contained in the data of the designed logic circuit is read from the physical library in a step S12. Blocks (macros) and cells are placed on an LSI chip in a step S13.

FIG. 10 shows the blocks and the cells that are placed on an LSI chip 100 in the step S13. A cell E comprises a combination of basic cells BC, and blocks A–F, G are embedded among basic cell arrays. The positional relationship between the blocks A–F and the cell E is the same as the positional relationship shown in FIGS. 6A–6C. In the example shown in FIG. 10, a block G is located at a corner of the LSI chip 100. Input/output cells 41 are arranged on outer peripheral edges of the LSI chip 100. Electrode pads positioned outwardly of the input/output cells 41 are omitted from illustration.

In FIG. 9, adjacent blocks are grouped in a step S14 according to the grouping process shown in FIG. 5. As described above with reference to FIGS. 6A–6C, the blocks A, B, F are put together into one group.

Then, a layout of power supply interconnections is designed. As shown in FIGS. 9 and 11, large power supply rings 34, 35 surrounding the basic cell arrays and the blocks are placed inwardly of the input/output cells 41 on the LSI chip 100 in a step S15. Specifically, since the step S15 is a designing step, data of the power supply rings 34, 35 is added to layout data. Adding data of the power supply rings 34, 35 is described as generating power supply rings in the sequence shown in FIG. 9. Either one of the power supply rings 34, 35 provides the power supply $V_{DD}$, whereas the other provides the power supply $V_{SS}$. The power supply rings 34, 35 comprise power supply interconnections connected to power supply pads 42, 43 through input/output cells.

Then, power supply rings 36, 37, 38, 39 are generated around the group of the blocks A, B, F, the block C, and the block D in a step S16. No new power supply ring is generated around the block G because it employs the power supply rings 34, 35. Power supply ring data for the power supply rings 36, 37 around the group of the blocks A, B, F are generated such that they have sufficient interconnection widths for supplying currents that will be consumed by the blocks A, B, F.

Power supply interconnections 50, 51 for connecting the power supply rings 36, 37, 38, 39 to power supply terminals (not shown) on block sides facing the power supply rings 36, 37, 38, 39 are generated in a step S17. Widths of the power supply interconnections 50, 51 are designed to be sufficiently large to supply currents that will be consumed by the blocks, and given as attribute data of the power supply terminals.

Finally, internal power supply interconnections 52, 53 in grid-shaped for connecting the power supply rings 34, 35 to the arrays of basic cells BC and the power supply rings 36, 37, 38, 39 of blocks and group are generated in a step S18. The internal power supply interconnections 52, 53 may extend in a grid pattern irrespective of the basic cell arrays, and may provide the power supplies to the basic cells through branch interconnections therefrom. The internal power supply interconnections 52, 53 simply extend horizontally and vertically from the power supply rings 34, 35 and are connected to the power supply rings 36, 37, 38, 39 where the internal power supply interconnections 52, 53 meet the power supply rings 36, 37, 38, 39. Therefore, some of the internal power supply interconnections 52, 53 are connected through the power supply rings 36, 37, 38, 39 of blocks or group.

Parallel ones of the internal power supply interconnections 52, 53 constitute power supply rings, and are connected to vertical ones of the internal power supply interconnections 52, 53. The pitch or spacing of the power supply rings 36, 37, 38, 39 for blocks or group and the pitch or spacing of the grid-shaped internal power supply interconnections 52, 53 are not correlated to each other.

The grid-shaped internal power supply interconnections 52, 53 and the power supply rings 34, 35, 36, 37, 38, 39 are constructed as multilayer interconnections on the LSI chip 100. The horizontal power supply interconnections and the vertical power supply interconnections comprise different interconnection layers, respectively. Therefore, power supply interconnections in upper and lower layers which provide the same power supply $V_{DD}$ or $V_{SS}$ are interconnected via holes (not shown).

The power supply interconnection data on the LSI chip 100 are generated as described above, and stored as layout data in the file 15 is shown in FIG. 2. The sequences shown in FIGS. 5 and 9 may be executed by a computer according to the layout program which is stored in the file 16.

In the above embodiment, the number of power supply terminals of each of the blocks and the widths of power supply interconnections from the power supply terminals to the power supply rings are designed such that the power supply terminals on two sides of each of the blocks are capable of supplying necessary currents to be consumed by the blocks, and are stored as attribute data of each of the blocks in the physical library.

Figure 12:
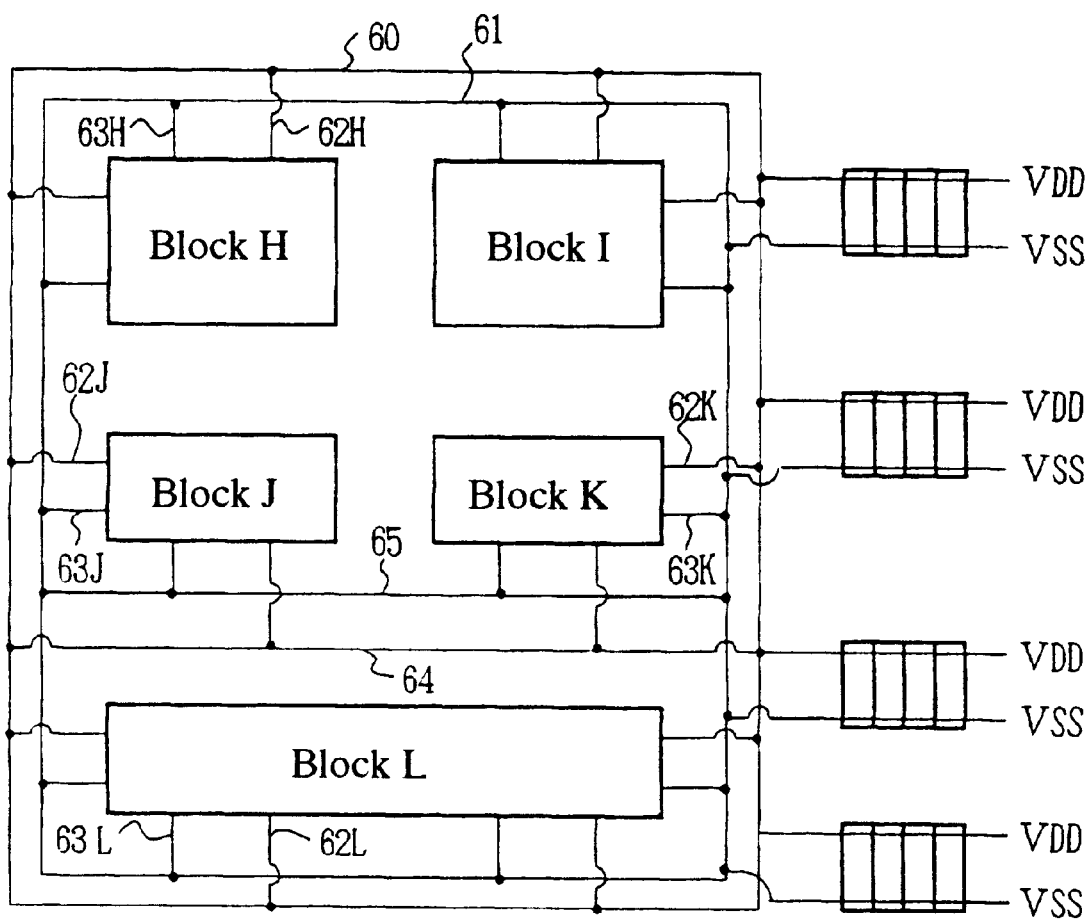
FIG. 12 is a block diagram showing branch power supply rings.

It is assumed that, as shown in FIG. 12, blocks H–L are put together into one group, and two common power supply rings 60, 61 is generated for the blocks H–L. In the step S17 shown in FIG. 9, power supply interconnections 62, 63 extending from the power supply terminals on block sides facing the common power supply rings 60, 61 to the common power supply rings 60, 61 are generated. The blocks H, I have two sides facing the common power supply rings 60, 61, and the block L has three sides facing the common power supply rings 60, 61. The blocks J, K have only one side facing the common power supply rings 60, 61. Therefore, no sufficient current may possibly be supplied to the blocks J, K.

To eliminate such a shortcoming, branch power supply rings 64, 65 extend from the common power supply rings 60, 61 for connection to power supply terminals on sides of the blocks J, K respectively which face the branch power supply rings 64, 65. Since no dedicated power supply rings are placed around the blocks J, K, a space around the blocks J, K is not occupied by such dedicated power supply rings.

A condition in which only one side of a block, e.g., each of the blocks J, K, faces the common power supply rings may be avoided in the grouping algorithm. For allowing to group blocks whose only one side faces the common power supply rings, the power supply terminals on one side and the widths of power supply interconnections connected thereto may be designed so as to be capable of supplying necessary currents to the blocks. However, if blocks are designed such that power supply terminals on two sides of each of the blocks are capable of supplying sufficient currents to the blocks, and also if the grouping algorithm allows some of the blocks to have only one side facing the common power supply rings, then it is necessary to permit the branch power supply rings 64, 65 to be generated. Since the branch power supply rings 64, 65 need to supply currents only to the blocks J, K, the branch power supply rings 64, 65 may have widths large enough to pass such currents, i.e., smaller than the widths of the power supply rings 60, 61.

Figure 13:
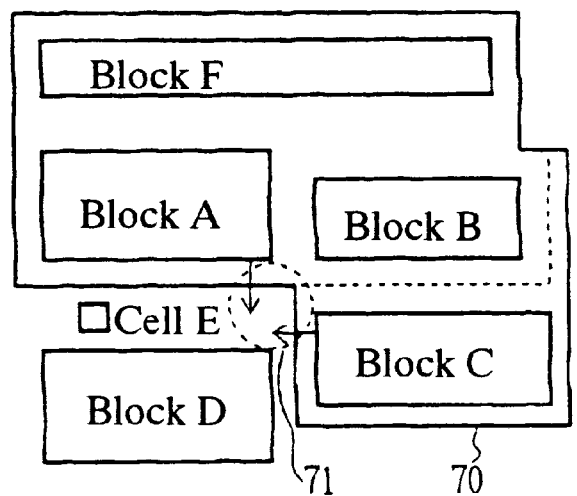
FIG. 13 is a block diagram illustrative of a condition that confronting sides of blocks need to be equal to each other in order to group the blocks.

FIG. 13 illustrates a condition that confronting sides of blocks need to be equal to each other in order to group the blocks. As shown in FIG. 6(C), the block C positioned adjacent to the group G2 has a side of different length which confronts the group G2. In FIG. 13, the block C is included in the group of blocks A, B, F, and a power supply ring 70 is placed around the group. The power supply ring 70 has a recess in its configuration at a region 71. In the region 71, interconnections from the blocks A, C are crowded as indicated by the arrows. Furthermore, vertical and horizontal interconnections of the power supply ring 70 are connected via holes in the region 71. Therefore, the recess in the configuration of the power supply ring 70 at the region 71 is not preferable.

Figure 14:
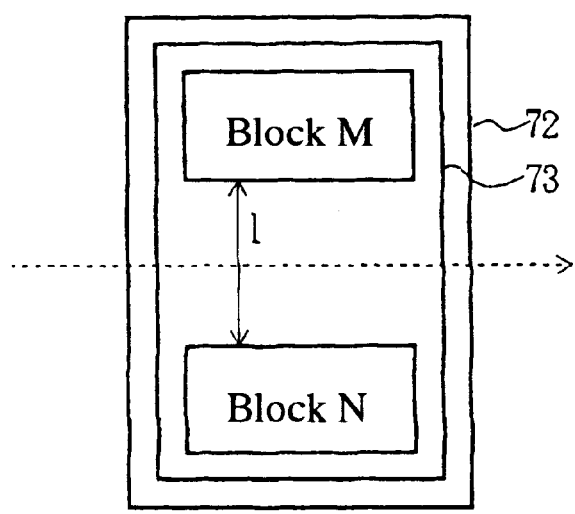
FIG. 14 is a block diagram illustrative of a condition that blocks need to be positioned adjacent to each other in order to be grouped.

FIG. 14 illustrates a condition that blocks need to be positioned adjacent to each other in order to be grouped. In FIG. 14, two blocks M, N which are widely spaced from each other by a large distance 1 are grouped together, and power supply rings 72, 73 are placed around the blocks M, N. The power supply rings 72, 73 prevent other interconnections (indicated by the dotted line) from being passed through the area between the blocks M, N. As a result, such other interconnections should be extended around the blocks M, N, taking up an extra space.

Figure 15:
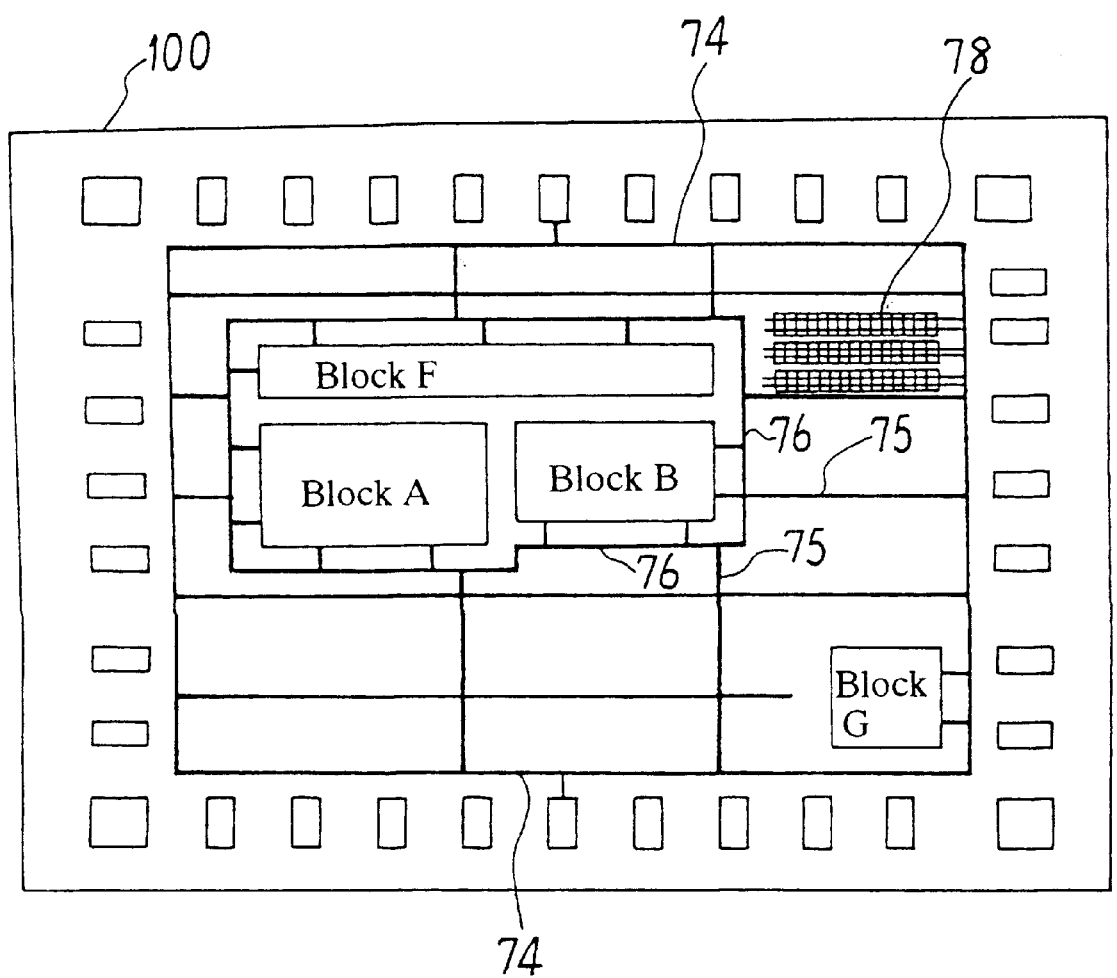
FIG. 15 is a block diagram of an another layout of power supply interconnections on an LSI chip according to the present invention.

FIG. 15 shows an another layout of power supply interconnections on an LSI chip according to the present invention. The layout of power supply interconnections shown in FIG. 15 is similar to the layout of power supply interconnections shown in FIG. 11 except for grid-shaped internal power supply interconnections 75 which connect a power supply ring 74 (shown as a single power supply ring for the sake of brevity) to a power supply ring 76 around the group of blocks A, B, F. Power supply interconnections for supplying currents to basic cell arrays 78 are branched from the grid-shaped internal power supply interconnections 75.

Figure 16:
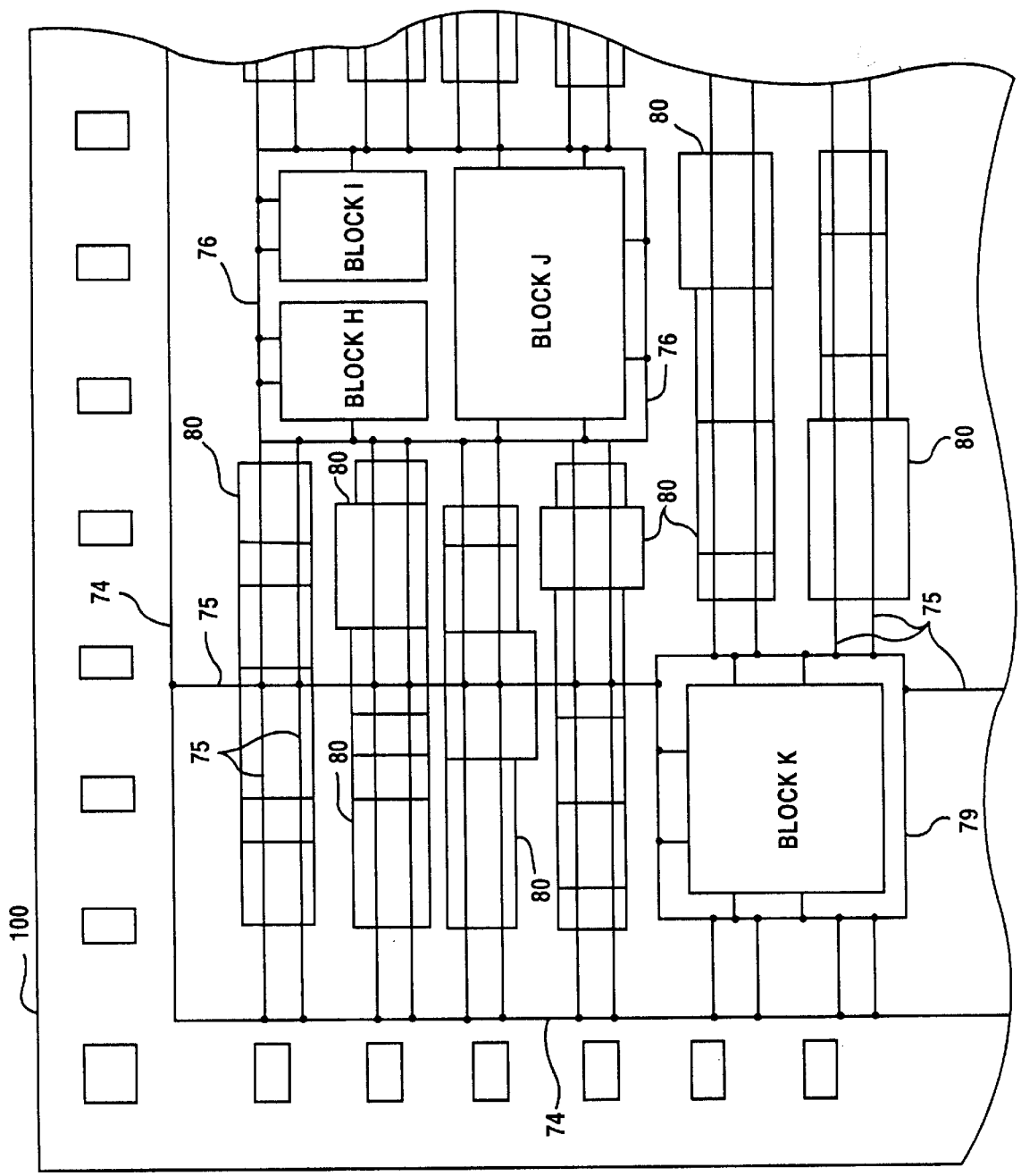
FIG. 16 is a fragmentary block diagram of a layout of power supply interconnections on a standard cell according to the present invention.

FIG. 16 shows a layout of power supply interconnections on a standard cell according to the present invention. Those parts shown in FIG. 16 which are identical to those shown in FIG. 15 are denoted by identical reference numerals. As with the layout shown in FIG. 15, the layout shown in FIG. 16 includes a power supply ring 74 (shown as a single power supply ring for the sake of brevity), grid-shaped internal power supply interconnections 75, a common power supply ring 76 around a group of blocks H, I, J, and a power supply ring 79 around a single block K, on a chip 100.

The standard cell includes an array of cells 80 of different types, rather than basic cell arrays. The cells 80 have power supply terminals located in equivalent positions for being supplied with currents from the internal power supply interconnections 75. Inasmuch as the amount of power supply interconnections differs depending on the type of the cells 80 in the array, the distance between the cell arrays is determined depending on the amount of power supply interconnections.

In FIG. 16, the blocks H, I, J are put together into one group, and are supplied with currents from the common power supply ring 76. The power supply rings 76, 79 are arranged according to rules different from rules for the internal power supply interconnections 75. The power supply rings 76, 79 for the embedded group and block are connected to the internal power supply interconnections 75.

With the arrangement of the present invention, as described above, the number of power supply terminals of blocks or macros and the width of power supply interconnections connected to the power supply terminals are designed such that they can supply sufficient currents even if the power supply terminals on less sides than the four sides of the blocks are connected to the power supply interconnections. The data of the designed number and width are stored as attribute data of the blocks in the physical library. Adjacent blocks are grouped, and a common power supply ring is generated for the group of blocks. The width of the common power supply ring is set to a value capable of supplying a total of currents consumed by the blocks of the group.

Consequently, a space taken up on a chip by the common power supply ring may be smaller than would be if power supply rings were assigned to the respective adjacent blocks. As a result, more circuits may be integrated on the chip.

Although certain preferred embodiments of the present invention have been shown and described in detail, it should be understood that various changes and modifications may be made therein without departing from the scope of the appended claims.

What is claimed is:

1. A method of making an integrated circuit device having a plurality of cells and a plurality of arrays of cells on a chip and a plurality of circuit blocks larger in scale than the cells and embedded among the arrays of cells, the circuit blocks having power supply terminals on their sides, comprising the steps of:

placing the cells and the circuit blocks in a region of a chip;

grouping adjacent ones of said circuit blocks;

generating a group power supply ring around the grouped circuit blocks in common and a block power supply ring around another one of the circuit blocks; and generating a grid-shaped pattern of internal power supply interconnections on the chip which are connected to said group power supply ring or said block power supply ring.

2. The method according to claim 1, wherein said step of grouping adjacent ones of said circuit blocks comprises the steps of:

selecting a circuit block or a group of circuit blocks adjacent to a given circuit block or a given group of circuit blocks with no cell interposed therebetween, the circuit blocks or groups of circuit blocks having confronting sides having substantially the same length as each other and being close to each other; and grouping the circuit blocks or groups of circuit blocks.

3. A method according to claim 1, further comprising the step of:

generating power supply interconnections connecting said group power supply ring to power supply terminals on sides of the grouped circuit blocks which correspond to said group power supply ring.

4. A method according to claim 1, wherein said group power supply ring has a width large enough to supply currents to be consumed by said grouped circuit blocks.

5. A method according to claim 3, wherein said power supply interconnections have widths large enough to supply currents to be consumed by said grouped circuit blocks.

6. A method of making an integrated circuit device having a plurality of arrays of cells on a chip and a plurality of circuit blocks of a different scale to that of the cells and embedded among the arrays of cells, comprising the steps of:

placing the cells and the circuit blocks in a region of the chip;

grouping adjacent ones of the said circuit blocks;

generating a group power supply ring around the grouped circuit blocks in common; and generating a pattern of internal power supply interconnections on the chip, connected so as to supply power to the said group power supply ring.

* * * * *